United States Patent [19]
Neumann

[11] Patent Number: 5,243,537
[45] Date of Patent: Sep. 7, 1993

[54] METHOD AND APPARATUS FOR RAPID MEASUREMENT OF AC WAVEFORM PARAMETERS

[75] Inventor: Leopold Neumann, Lexington, Mass.

[73] Assignee: Analogic Corporation, Peabody, Mass.

[21] Appl. No.: 633,461

[22] Filed: Dec. 21, 1990

[51] Int. Cl.$^5$ .............................................. G01R 21/00
[52] U.S. Cl. ..................................... 364/487; 364/483
[58] Field of Search ............... 364/483, 487, 581, 582; 324/141, 142, 103 R

[56] References Cited

U.S. PATENT DOCUMENTS 5,099,195  3/1992  Greer et al. ........................ 324/142

*Primary Examiner*—Jack B. Harvey
*Assistant Examiner*—Ellis B. Ramirez
*Attorney, Agent, or Firm*—Schiller & Kusmer

[57] ABSTRACT

Errors introduced into ac waveform measurements based on discrete amplitude samples because the waveform period is not an integral number of sampling intervals are substantially averaged out by computing the aggregate average of the set averages of sets of samples. Each set is taken over approximately an integral number of waveform cycles, and the set terminations are spread uniformly over approximately an integral number of cycles. Each set may overlap the previous set by all but one sample. As a short cut to the computation, each sample of the first set may be weighted with a weighting factor that is a respective member of an arithmetic series, starting at one and increasing in steps of one. Each remaining sample may be weighted by a factor that is a member of symmetrical series decreasing in steps of one and ending in one. The sum of all the weighted samples is accumulated and divided by the sum of all the weighting factors to produce the average of averages, or dc value of the waveform. The rms value can be produced by squaring the samples before weighting and taking the square root of the average of averages.

20 Claims, 2 Drawing Sheets

METHOD AND APPARATUS FOR RAPID MEASUREMENT OF AC WAVEFORM PARAMETERS

FIELD OF THE INVENTION

This invention is in the field of electrical measurements, and more particularly to the measurement of ac waveform parameters.

BACKGROUND OF THE INVENTION

In many uses of alternating current, it is important to make rapid and accurate determinations of power and power factor and of dc and rms values of voltage and current. Where microprocessor controls are used, for example, there is often a window of a small fraction of a second available for the measurement. Until now, however, accurate measurements have not been rapid, and vice versa. One common method of measuring these parameters is based on the heating effect of the waveform. As such, it involves the thermal inertia of a heating element and is therefore inherently slow. Another method is based on sampling the instantaneous value of the waveform at uniform time intervals several times per cycle. To find the dc value of a voltage waveform by this method, for example, one has merely to average the voltage samples, including the polarity sign, over an integral number of cycles. This can be expressed mathematically by equation (1), in which N is the number of sampling intervals used in the calculation.

$$V_{dc} = \frac{1}{N} \sum_{n=1}^{n=N} v_n \quad (1)$$

Similarly, the rms value of voltage can be determined by squaring each voltage sample, averaging the squared values, and taking the square root of the result. An equation expressing this process is:

$$V_{rms} = \sqrt{\frac{1}{N} \sum_{n=1}^{n=N} v_n^2} \quad (2)$$

Unfortunately, while sampling and calculating can be accomplished very rapidly, accurate determination of the parameters by this method requires knowledge of the exact frequency or period of the waveform. In order to sample over an integral number of cycles, the period of the waveform must be an exact multiple of the sampling interval. Otherwise, to minimize the error introduced by sampling over other than exact full cycles, the measurement must normally be extended over a large number of cycles. At the low frequencies common in power distribution, this method becomes far from rapid.

An object of this invention is a precise determination of ac waveform parameters that does not require prior knowledge of the waveform period but yet requires measurement over only a relatively short period of time, which can be as few as two approximate waveform cycles.

SUMMARY OF THE INVENTION

The method of the invention for determining a parameter of an ac waveform to a high degree of precision comprises the steps of:

1. Sampling the waveform at a predetermined sampling rate;
2. Converting the samples to data symbols;
3. Identifying a first set of data symbols corresponding to the samples taken over approximately a whole number of waveform cycles;
4. Generating by computer means the aggregate average of the respective set averages of the first set and additional sets of data symbols;

each set corresponding to samples taken over approximately a whole number of cycles; and the set terminations being spread uniformly over approximately a whole number of cycles; and 5. Computing the precise parameter from the aggregate average.

If the data symbols represent the sample values, the aggregate average is itself the dc value of the waveform. If the data symbols represent the squared values of the samples, the square root of the aggregate average is the rms value of the waveform. Power related parameters are determined using data symbols that represent the product of voltage samples and corresponding current samples.

Apparatus for practicing the invention to produce at least one waveform parameter may comprise sampling means for periodically sampling the waveform at a predetermined sampling rate, converting means for converting the samples to data symbols, weighting means for weighting each of a first group of consecutive symbols with a weighting factor that is a respective member of an ascending arithmetic progression and each of a second group of consecutive symbols with a weighting factor that is a respective member of a descending arithmetic progression, accumulating means for accumulating the sum of the weighted symbols, and dividing means for dividing the accumulated sum by the sum of the weighting factors to produce a precise average of the data symbols as a function of the parameter.

DESCRIPTION OF THE DRAWING

The foregoing and other features and advantages of the invention will be better understood from the following detailed description taken with the accompanying drawing in which.

DETAILED DESCRIPTION

Figure 1:
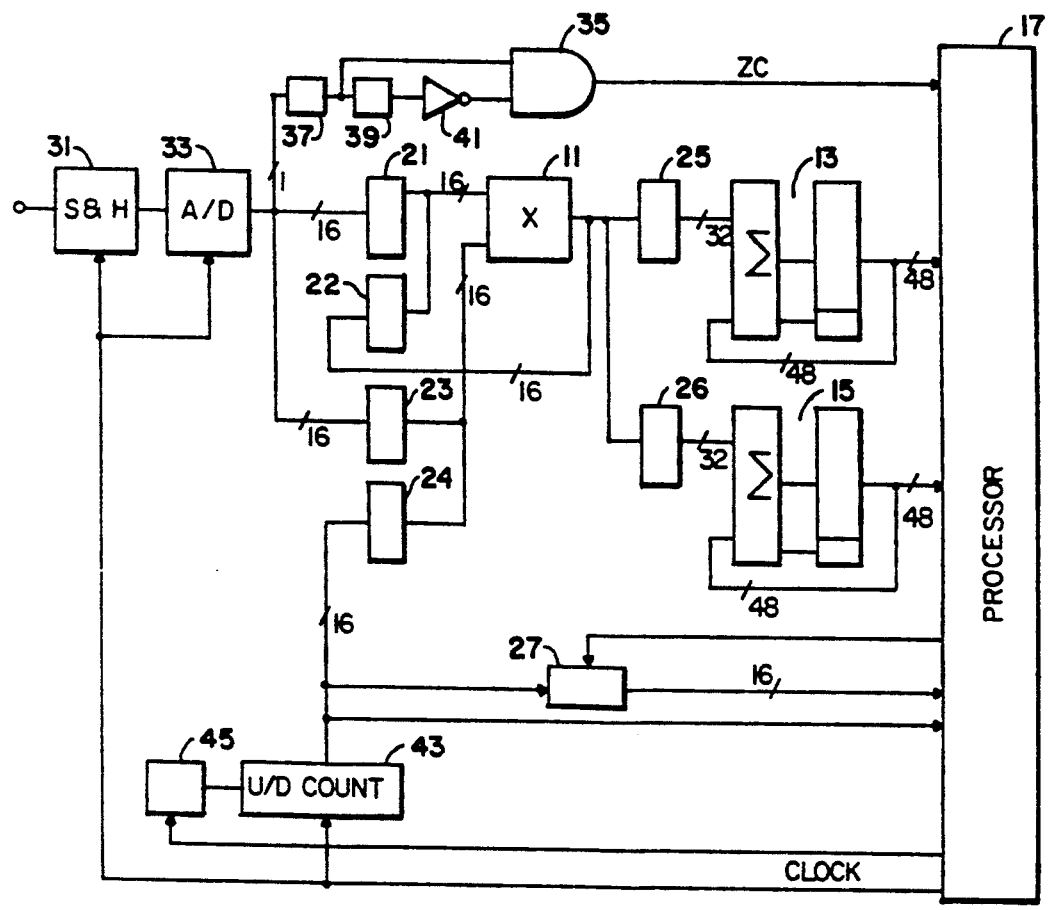
FIG. 1 is a diagrammatical representation of one embodiment of the invention for determining dc and rms values of voltage or current.

This invention is based on taking an average of averages. Consider, for example, the determination of dc voltage level from a set of many samples of instantaneous voltage taken at uniform sampling intervals over a sampling period that is only approximately an integral number of cycles of the waveform. This can be expressed by equation (3), in which $N_p$ is the number of samples in the sampling period.

$$V_{av} = \frac{1}{N_p} \sum_{n=1}^{n=N_p} v_n \quad (3)$$

The result, of course, includes an error due to the difference between the sampling period and an exact integral number of periods of the waveform. The error represents the part of a cycle that was erroneously either omitted or included in the sampling period. The amount of the error depends upon the number of samples in the sampling period and the value of the waveform where the error occurs, that is, at the beginning or end of the sampling period for the set of samples used in the determination.

According to this invention, the error due to an inaccurate sampling period can be greatly reduced if a number of determinations are averaged in which the sampling period terminations are spread uniformly over an approximate integral number of waveform cycles. By this means, the errors are equivalent to waveform values spread uniformly over a waveform cycle and are effectively averaged out. Further, errors due to noise and the granularity of the sampling process are also greatly reduced through the average of averages process. Thus, even if a sampling rate poorly matched to the waveform period would leave an intolerable error in a measurement taken over several cycles, the method of the invention produces a much more precise measurement. Fortunately, also according to a feature of this invention, the sampling periods can overlap to greatly compress the measurement time. An accurate measurement of the dc bias voltage may be determined, therefore, if $N_p$ samples of voltage are averaged in a set and $N_p-1$ sets are themselves averaged, where each set of samples starts and ends one sample later than the previous set. This can be expressed mathematically by equation 4.

$$v_{av2} = \frac{1}{N_p - 1} \sum_{m=1}^{N_p-1} \frac{1}{N_p} \sum_{n=m}^{m+N_p} v_n \qquad (4)$$

$N_p$ is, again, the number of samples in a sampling period, which is approximately an integral number of waveform periods.

Equation 4 presupposes for maximum precision that the sampling period, as determined by $N_p$, is slightly greater than an integral number of waveform periods. This is more probable and therefore preferable. If, in fact, the sampling period is slightly less than an integral number of waveform periods, maximum precision will be attained by adding one more set to our summation, that is, $N_p$ sets of $N_p$ samples. In either case, the additional error due to one more or one fewer set is very small.

Now, to accomplish the above in a conventional manner would take a great deal of random access memory (RAM). It may be noted, however, that in the overlapping arrangement described above, the first sample appears in only one set, the second in two sets, etc. In taking the average of averages, therefore, the first sample is added once, the second twice, the third three times, etc., each sample being added one more time than the previous sample until the first sample of the last set, which is added $N_p-1$ times. The number of times each remaining sample is added starts at $N_p-1$ and is thereafter diminished by one for each succeeding sample until the last sample is added only once. The same results can therefore be accomplished if each sample of the first group of $N_p-1$ samples is multiplied by a weighting factor that is a respective member of a geometric progression starting with one and ending with $N_p-1$. Each sample in the second group of $N_p-1$ samples can then be multiplied by a weighting factor that is a respective member of a geometric progression starting with $N_p-1$ and diminishing to 1. The sample $v_{N_p}$ is the last sample of the first set and the second sample of the last set.

This average of averages determination of dc bias voltage can be represented mathematically by equation 5.

$$V_{dc} = \frac{\sum_{n=1}^{N_p-1} n v_n + \sum_{n=N_p}^{2N_p-2} (2N_p - n - 1)v_n}{N_p(N_p - 1)} \qquad (5)$$

Rms values can be determined accurately in a similar manner by squaring the original sample data and taking the square root of the average of averages, as indicated by equation 6.

$$V_{rms} = \sqrt{\frac{\sum_{n=1}^{N_p-1} n v_n^2 + \sum_{n=N_p}^{2N_p-2} (2N_p - n - 1)v_n^2}{N_p(N_p - 1)}} \qquad (6)$$

A major advantage of this method is that it can readily be implemented using commonly available large scale integrated semiconductor chips. A very useful embodiment of the invention that may be implemented using an analog to digital converter (A/D) chip and a digital signal processor (DSP) chip is shown in diagram form in FIG. 1. In this diagram, as is common in diagrams of circuits implemented by digital signal processors, lines connecting function blocks represent data flow rather than hard connections.

In the embodiment of FIG. 1, a serial multiplier 11, a pair of accumulators 13 and 15 and several registers 21-27 are controlled by a relatively simple microprocessor 17. Although it is not a requirement of the invention, all of these elements may be included within a single DSP chip. One input of multiplier 11 may be accessed by registers 21 and 22; the other input of multiplier 11 may be accessed by registers 23 and 24. Access in this case can be via sixteen-bit busses. The output of multiplier 11 can be fed to any one of three registers 22, 25 or 26. Accumulators 13 and 15, which can advantageously include carry and rounding off capability, take their inputs from registers 25 and 26, respectively. A sample-and-hold circuit (S&H) 31 is connected to sample the waveform voltage and drives an analog-to-digital converter (A/D) 33; the output of A/D 33 may be accessed by registers 21 and 23.

A zero-crossing detector circuit may include an AND gate 35, one input of which is fed by the series combination of two shift register cells 37 and 39 and an inverting amplifier 41. Cell 37 is connected to receive the most significant bit out of A/D 33. The other AND gate input is connected between the shift register cells. The zero-crossing detections may be noted by processor 17.

An up/down counter 43 is toggled to change counting direction by a toggle 45, upon a signal from the processor. The count output of counter 43 is fed to index register 24 and to a latching register 27, that is toggled by the processor.

The embodiment of FIG. 1 operates to generate an accurate measurement of dc voltage, rms voltage and the rms value of the ac content of a waveform according to the invention in the following manner: Sampling circuit 31 continually samples the voltage of the waveform at a sampling rate determined by a sample clock, which may be generated by processor 17. A/D converter 33 converts each analog sample value to a digital number, which is fed to registers 21 and 23. The first bit, i.e. the sign bit, of each number out of A/D 33 enters the first cell 37 of the zero-crossing detector. As each new voltage sample is processed, the new digital number enters registers 21 and 23, and the bit in cell 37 moves into cell 39 to be replaced by the sign bit of the new sample. AND gate 35 is enabled only when there is a zero sign bit in cell 39 and a 1 sign bit in cell 37. This condition occurs only upon a minus-to-plus zero-crossing of the waveform. The zero-crossing output signal causes processor 17 to operate toggle 45 to start counter 43 counting up and placing a 1 in registers 24 and 27. Counter 43, controlled by the same clock signal as sample-and-hold 31 and A/D 33, counts up at the sampling rate.

Within one sampling interval, i.e. the time between successive samples, processor 17 causes the following operations to occur: Multiplier 11 multiplies the contents of register 21, which represents the first sample value, by the contents of register 24, which represents the first weighting factor, 1, and places the product in register 25. Multiplier 11 may next multiply the contents of register 21 by the contents of register 23, thereby squaring the value of the first sample, and place the product in register 22. Multiplier 11 finally multiplies the contents of register 22 by the contents of register 24, and places a number representing the weighted square of the first sample in register 26. In the meantime, accumulator 13 adds the number in register 25 to the accumulated value, which is 0 at this initial point. Finally, and still within the first sample interval, accumulator 15 adds the value in register 26 to its accumulated value, 0.

When the second sample after the zero-crossing indication is clocked out of A/D 33, counter 43 is incremented to 2, and the new sample value in register 21 is multiplied by the new weighting factor, 2, in register 24. The new product, stored in register 25, is added to the value accumulated by accumulator 13. Similarly, the square of the second sample, weighted by the factor 2 is added to the accumulation in accumulator 15. As each new sample word appears, the weighting factor is incremented by 1, and the weighted values of voltage and squared voltage are added to the respective accumulated sums of all the previous values since the positive-going zero-crossing.

When the next positive-going zero-crossing is indicated, signifying the approximate end of a cycle of the voltage waveform, register 27 is latched by processor 17 and stores the current value of counter 43, i.e., $N_p$. At the same time, toggle 45 causes counter 72 to reverse direction and start counting down, thereby decrementing the value of the weighting factor back to $N_p-1$. Succeeding samples are weighted and added to the accumulated total as before, until the zero-crossing detector again signifies the end of an approximate cycle. At this time, the counter has counted back to zero; the value $N_p$, latched in register 27, is available to the processor, together with the accumulated sum of weighted voltage samples and the accumulated sum of the weighted values of the squares of the voltage samples. The processor then divides each of the accumulated sums by the product of $N_p$ and $N_p-1$ to obtain the average of averages of both sets of accumulated data. These figures amount to accurate determinations of $V_{dc}$, according to equation (5), and the square of $V_{rms}$, easily derived from equation (6), respectively. Processor 17 can readily take the square root of the latter to produce $V_{rms}$. In addition, it can take the square root of the difference between the squares of $V_{rms}$ and $V_{dc}$, according to equation 7, to obtain the rms value of the ac component of the waveform.

$$V_{ac\ rms} = \sqrt{V_{rms}^2 - V_{dc}^2} \tag{7}$$

It will be recognized that an approximate integral number of waveform cycles can be identified to practice the invention by means other than the digital zero-crossing detector of FIG. 1. An analog zero-crossing detector could, of course, be connected to directly sense the waveform. Alternatively, digital sensing means could use additional digits of the numbers out of A/D 33 to determine approximate cycle endings. The polarity and amplitude of the waveform can be noted at any arbitrary starting point without the need to wait for a zero-crossing, and the slope direction can be determined by comparing the amplitudes of adjacent samples. For an increasing amplitude at the start of the measurement, approximate whole cycles will be indicated by an equal or greater amplitude of the same polarity after a lesser amplitude. Similarly, for a decreasing starting amplitude, the cycle detector would look for an equal or lesser amplitude of the same polarity after a greater amplitude.

In order that accuracy may be insured over a wide frequency range, latching of register 27 and reversing the count direction of counter 72 may be delayed until the end of an approximate cycle after the contents of register 27 has reached a predetermined minimum number, such as, for example, 1000. This has the effect of increasing the number of waveform cycles in the sampling period for higher frequency waveforms, where there are fewer samples per waveform period.

To implement the embodiment of FIG. 1, one might use, for example, one of the 16-bit A/D converter chips common to the music reproduction industry, operating at 100,000 conversions per second. This allows 10 microseconds for all of the DSP processing. A DSP chip, therefore, with an instruction cycle shorter than 200 nanoseconds would allow up to 50 instructions on each sample of data in real time. A 16-bit up/down counter 43 can provide $2^{16}$ different weighting factors, allowing $N_p$ to be as high as 2000. A 16 by 16-bit multiplier 11, outputting 32 bits to 48-bit accumulators 13 and 15 allow accumulations of 4000 samples without rounding. With this arrangement, the squared values in register 22 would be rounded to 16 bits, which nonetheless will generate very accurate values of rms voltage. If larger unrounded accumulations are desired, a new accumulation can be started at $N_p$.

For even greater accuracy, DSP's are available with larger capacities and higher instructional speed. The Motorola DSP-56000, for example, has a 24 by 24-bit signed multiplier, two 56-bit accumulators, and more than an adequate number of addressable registers. Further, it has 512 24-bit words of internal RAM, masked ROM capability and better than 100 nanosecond instruction cycle.

The embodiment described, therefore, can produce accurate measurements of dc and rms voltage over a wide frequency range in a small fraction of a second. Dc and rms values of current can be generated in the same manner if samples of current instead of voltage are used as input. Current samples for this purpose are, of course, voltages proportional to current and are usually taken across a small resistance in series with the circuit under test. If both current and voltage are simultaneously sampled, power, power factor and phase angle can be quickly and accurately determined according to the invention as well.

Figure 2:
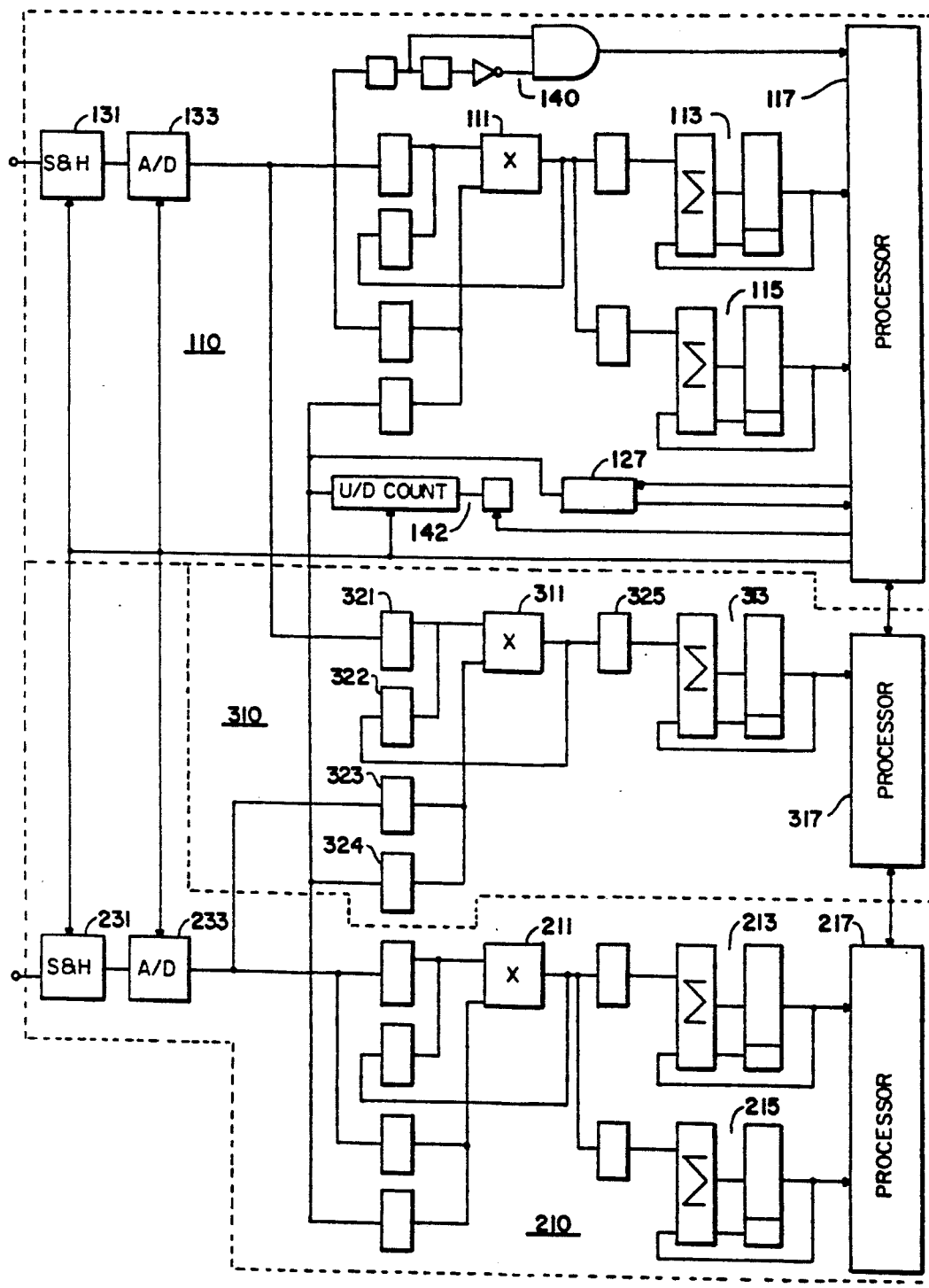
FIG. 2 is a diagrammatical representation of another embodiment of the invention for determining dc and rms values of voltage and current, power and power factor.

To generate all of the mentioned parameters of an ac waveform, one might use an embodiment of the invention expanded from that of FIG. 1 to include two A/D converters and three DSP chips, as shown in FIG. 2. This embodiment may be considered to be made up of three building blocks. A first building block may be a circuit 110, substantially identical to the embodiment of FIG. 1, for producing the voltage parameters as described above. In addition to a multiplier 111, accumulators 113 and 115, a processor 117 and the associated registers, therefore, circuit 110 includes S&H 131, A/D 133, a zero-crossing detector 140, a weighting factor generator 142 and a latch 127 for $N_p$.

A second building block 210 for processing current samples to obtain current parameters is similar to block 110. Corresponding components are consequently labeled with similar numbers with the prefix 2 instead of 1. Since simultaneous current and voltage samples are desired, the sampling clock pulses from processor 117 are used to control the S&H and A/D circuits of both blocks 110 and 210. Further, the weighting factors from generator 142, controlled by zero-crossing detector 140, may be used for weighting all data.

The third building block 310 of the embodiment of FIG. 2 needs only a single accumulator 313, multiplier 311, processor 317, and five associated registers, 321 through 325. The three building block processors communicate with one another so that the samples being processed will be synchronized. During each sampling interval, multiplier 311 multiplies the contents of register 321, which is the digital voltage sample from A/D 133, by the contents of register 323, which is the digital current sample from A/D 233, and places the product into register 322. Multiplier 311 then multiplies the contents of register 322, which is the instantaneous power drawn by the circuit under test, by the contents of register 324, which is the weighting factor from generator 142, and places the product in register 325 for accumulating in accumulator 313. After all products have been accumulated, processor 317 divides the total accumulation by the product of $N_p$ and $N_p-1$ to produce average power, P.

Block 110, therefore generates $V_{dc}$ and $V_{rms}$ from the voltage samples out of A/D 133, block 210 generates $I_{dc}$ and $I_{rms}$ from the current samples out of A/D 233, and block 310 generates P from both sets of samples. One of the processors may then determine power factor by dividing P by the product of $V_{rms}$ and $I_{rms}$ according to equation 8.

$$PF = \frac{P}{V_{rms}I_{rms}} \quad (8)$$

Finally, The phase angle between current and voltage may be determined from a look-up table according to equation 9.

$$\Phi = \cos^{-1}\frac{P}{V_{rms}I_{rms}} \quad (9)$$

It will, of course be recognized that since the current samples used in the above calculations are in reality voltage samples, as previously mentioned, the phase angle between any two voltage waveforms of the same frequency can be determined by the same process. In that case, in place of average power P, the process calculates the average of the instantaneous products of the two voltages.

It will also be recognized by those skilled in the art that while the embodiment of FIG. 2 has been described as comprising three DSP's, three separate chips are not in fact necessary to provide the described function according to the invention. What is needed is the ability in each sampling interval to make the eight indicated multiplications and to accumulate the five weighted products. With enough memory and processing speed, all of this could be accomplished with a single multiplier and summer. Each accumulation could simply be withdrawn from memory, recalculated and restored. Many other alternatives exist, including accumulating the weighted products through $N_p-1$, storing the set of accumulations, starting a new set of accumulations for $N_p$ through $2N_p-2$ and adding the two sets of accumulations.

A method and apparatus have therefore been described for determining to a high degree of precision in a very short time the parameters of an ac waveform. Alternative arrangements in addition to the several described herein may occur to those skilled in the art which do not depart from the spirit and scope of this invention, as defined by the appended claims.

I claim:

1. An AC waveform measurement apparatus for determining at least one electrical parameter of an AC waveform contained in an input signal without prior knowledge of the waveform's period, said apparatus comprising:

input means for receiving the input signal;

sampling means, coupled to said input means and including a sampling means output, for periodically sampling said AC waveform at a predetermined sampling rate defining individual sampling intervals within which corresponding samples of the AC waveform are taken, and for generating at the sampling means output a plurality of discrete samples each of which is representative of the value of the AC waveform within the corresponding sampling interval;

converting means, coupled to said sampling means output, for converting, in accordance with a predetermined function related to said electrical parameter, each of said discrete samples to a corresponding data signal; and processing means for processing said data signals in order to determine at least one unknown electrical parameter of the AC waveform, said processing means comprising:

(a) signal sorting means for sorting said data signals into at least a first group of one or more consecutive data signals, and at least a second group of one or more consecutive data signals;

(b) signal weighting means, coupled to said signal sorting means, for modifying each of said first group of consecutive data signals in accordance with a first weighting factor, said first weighting factor being determined in accordance with an ascending arithmetic progression and (ii) said second group of consecutive data signals in accordance with a second weighting factor, said second weighting factor being determined in accordance with a descending arithmetic progression so as to produce corresponding weighted data signals;

(c) signal weighting factor accumulator means for accumulating the weighting factors applied to each of said data signals;

(d) signal accumulating means for accumulating the sum of said weighted data signals; and (e) determination means for determining the electrical parameter of the AC waveform, said determination means comprising signal dividing means for dividing said accumulated signal sum by said accumulated signal weighting sum so as to produce a precise average value of said data signals, wherein said electrical parameter is derived from said precise average value of said data signals.

2. The apparatus as claimed in claim 1, wherein said predetermined function is such that the data signals comprise the respective values of the samples of said input signal so that the precise average value of said data signals is the measured dc value of said waveform.

3. The apparatus as claimed in claim 1, wherein said predetermined function is such that data signals comprise the respective values of the squares of the corresponding samples of said input signal; and wherein said determination means for determining the electrical parameter further comprises means for determining the square root of said precise average value so that the square root of said precise average value of said data signals is the measured rms value of said waveform.

4. The apparatus as claimed in claim 1, wherein the number of consecutive data signals in said first group is one greater than the number of consecutive data signals in said second group.

5. The apparatus as claimed in claim 1, wherein the number of consecutive data signals in the first group of consecutive data signals and in the second group of consecutive data signals are the same.

6. The apparatus as claimed in claim 1, wherein said signal weighting means comprises:

(a) signal weighting factor generating means for generating said weighting factors; and (b) signal weighting factor multiplying means for multiplying said weighting factors by the corresponding respective data signals in order to produce said weighted data signals; and wherein said signal weighting factor multiplying means and said signal accumulating means are each included within a digital signal processing circuit.

7. The apparatus as claimed in claim 1, wherein the processing means further includes means for determining the end of each cycle of the AC waveform, wherein the data signals comprising said second group of consecutive data signals correspond to a plurality of discrete samples produced by said sampling means over an aproximately integral number of cycles of the AC waveform of said input signal.

8. The apparatus as claimed in claim 1, wherein the processing means further includes means for determining the end of each cycle and the beginning of the next cycle of the AC waveform, and the data signals comprising said second group of consecutive data signals correspond to a plurality of discrete samples produced by said sampling means over the course of approximately one cycle of the AC waveform.

9. The apparatus as claimed in claim 1, wherein the processing means further includes means for determining the end of each cycle of the AC waveform, and the number of data signals in said first group of consecutive data signals is greater than the number of discrete samples which comprise a single cycle of the AC waveform of said input signal.

10. The apparatus as claimed in claim 1, wherein said first weighting factors comprise consecutive integers beginning with a value of one, and wherein said second weighting factors comprise consecutive integers ending with a value of one.

11. The apparatus as claimed in claim 1, wherein said signal weighting means further comprises up/down counting means for counting each of said data signals at the sampling rate.

12. The apparatus as claimed in claim 11, further comprising cycle detecting means for detecting the approximate completion of each cycle of said AC waveform of said input signal;

said up/down counting means selectively changing its direction of counting in response to the detection of the approximate completion of a predetermined number of cycles.

13. The apparatus as claimed in claim 12, wherein said cycle detecting means further comprises zero-crossing detection means for detecting the zero-crossings of the AC waveform of said input signal.

14. The apparatus as claimed in claim 13, wherein said zero-crossing detection means is coupled to said converting means and detects those points in time when the value of the AC waveform of the input signal crosses the zero-axis crossing point in at least one direction in connection with the values of said data signals.

15. The apparatus as claimed in claim 12, wherein said cycle detecting means further comprises:

sample sign detecting means for detecting the polarity of each of said discrete samples;

sample magnitude comparison means for comparing the magnitude of the first sample to be generated by said sampling with the magnitudes of subsequent samples generated by said sampling means and included in connection with a measurement; and cycle output means for generating a signal indicative of the end of an approximately predetermined number of cycles of the AC of said input signal in accordance with the detection by said sample sign detecting means and said sample magnitude comparison means of a subsequent sample having the same polarity as and a greater magnitude than said first sample after a sample has been detected within the measurement having a lesser amplitude than said first sample, when the second sample has a greater magnitude than said first sample, or upon the occurrence of a subsequent sample having the same polarity as and a lesser magnitude than said first sample after a sample has been detected within the measurement having a greater amplitude than said first sample when the second sample has a lesser magnitude than said first sample.

16. The apparatus as in claim 12, wherein said sampling means samples both the voltage AC waveform of said input signal and the associated current AC waveform of said input signal; and wherein said converting means generates a data signal representative of the instantaneous power value of each of said samples, so that the precise average value of said data singals is the measured average power delivered by the voltage waveform of said input signal.

17. The apparatus as claimed in claim 16, wherein by using said data signals representative of both the instantaneous voltage and current values of the AC of said input signal during corresponding sampling intervals, said apparatus may be used to measure the power, power factor and phase angle the AC waveforms of said input signal.

18. A method of measuring at least one electrical parameter of an AC waveform of an input signal without prior knowledge of the waveform's period, said method comprising the steps of:
   (a) periodically and repetitively sampling said waveform at a predetermined sampling rate to produce a first set of discrete samples of corresponding instantaneous values of said waveform;
   (b) converting each of said samples to a data signal;
   (c) identifying, while continuing steps (a) and (b) a first set of consecutive data signals corresponding to the samples taken over approximately a whole predetermined number of cycles of said AC waveform;
   (d) generating, by computer means, the aggregate average value of the respective set of average values of said first set of data signals in combination with additional similar sets of data signals, wherein each of said additional sets of consecutive data signals correspond to samples taken over approximately a whole predetermined number of waveform cycles, and wherein the termination point within said input signal waveform of each consecutive set of data signals is spread uniformly over approximately a whole predetermined number of waveform cycles; and
   (e) determining the electrical parameter of an input AC waveform as a function of said computed aggregate average.

19. The method as claimed in claim 18, wherein step (d) further comprises the steps of:
   (d) (1) weighting each data signal of said first set of consecutive data signals with a weighting factor that is a respective member of an ascending arithmetic progression, said progression starting with a value of one and increasing in steps having a value of one;
   (d) (2) weighting each subsequent data signal if a second set following the first set with a weighting factor that is a respective member of a decreasing arithmetic progression, said progression ending with a value of one and decreasing in steps having a value of one;
   (d) (3) accumulating the sum of all of said weighted data signals; and
   (d) (4) dividing said accumulated sum by the sum of all of said weighting factors.

20. The method as claimed in claim 19, wherein said data signals may be used to represent a value which is equal to the squares of the values of each of the respective waveform samples; and wherein Step (e) further comprises the step of taking the square root of said aggregate average to measure the rms value of said waveform.

* * * * *

UNITED STATES PATENT AND TRADEMARK OFFICE
CERTIFICATE OF CORRECTION

PATENT NO. : 5,243,537
DATED : September 7, 1993
INVENTOR(S) : Leopold Neumann

It is certified that error appears in the above-indentified patent and that said Letters Patent is hereby corrected as shown below:

Claim 1, column 8, line 63, after "of" insert -- (i) --.

Signed and Sealed this

Fifth Day of April, 1994

Attest:

BRUCE LEHMAN

*Attesting Officer*  *Commissioner of Patents and Trademarks*